United States Patent
Chen

(10) Patent No.: US 7,763,908 B2
(45) Date of Patent: Jul. 27, 2010

(54) DESIGN OF SILICON-CONTROLLED RECTIFIER BY CONSIDERING ELECTROSTATIC DISCHARGE ROBUSTNESS IN HUMAN-BODY MODEL AND CHARGED-DEVICE MODEL DEVICES

(75) Inventor: Jau-Wen Chen, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 799 days.

(21) Appl. No.: 11/189,217

(22) Filed: Jul. 25, 2005

(65) Prior Publication Data

US 2007/0045656 A1    Mar. 1, 2007

(51) Int. Cl.
H01L 29/74  (2006.01)

(52) U.S. Cl. ............... 257/107; 257/173; 257/357; 257/355; 257/356; 257/360

(58) Field of Classification Search ........... 257/354, 257/355, 356, 360, 365, 371, 401, 546, 335, 257/357, 107, 173, 124
See application file for complete search history.

(56) References Cited

U.S. PATENT DOCUMENTS

| | | | | |
|---|---|---|---|---|
| 5,182,220 | A * | 1/1993 | Ker et al. | 438/200 |
| 5,541,801 | A * | 7/1996 | Lee et al. | 361/56 |
| 6,072,219 | A * | 6/2000 | Ker et al. | 257/355 |
| 6,347,026 | B1 | 2/2002 | Sung et al. | 361/56 |
| 6,594,132 | B1 | 7/2003 | Avery | 361/111 |
| 6,605,493 | B1 | 8/2003 | Yu | 438/135 |
| 6,642,088 | B1 | 11/2003 | Yu | 438/155 |
| 6,747,861 | B2 | 6/2004 | Ker et al. | 361/111 |
| 6,768,617 | B2 | 7/2004 | Marr | 361/56 |
| 6,770,918 | B2 | 8/2004 | Russ et al. | 257/173 |
| 6,791,122 | B2 | 9/2004 | Avery et al. | 257/173 |
| 6,791,146 | B2 | 9/2004 | Lai et al. | 257/362 |
| 6,815,732 | B1 | 11/2004 | Vashchenko et al. | 257/107 |
| 6,815,775 | B2 * | 11/2004 | Ker et al. | 257/355 |
| 7,141,831 | B1 * | 11/2006 | Vashchenko et al. | 257/124 |
| 7,217,984 | B2 * | 5/2007 | Huang et al. | 257/452 |
| 2002/0149059 | A1 * | 10/2002 | Ker et al. | 257/355 |
| 2002/0167052 | A1 * | 11/2002 | Chang et al. | 257/355 |

OTHER PUBLICATIONS

Balasubramaniam, Shankar; *Advanced High-Speed CMOS (AHC) Logic Family*; Texas Instruments; SCAA034B Jan. 1998.

* cited by examiner

*Primary Examiner*—Thao X Le
*Assistant Examiner*—Thanh Y Tran
(74) *Attorney, Agent, or Firm*—Kermit D. Lopez; Luis M. Ortiz; Ortiz & Lopez, PLLC

(57) ABSTRACT

A silicon-controlled rectifier apparatus, comprising a substrate upon which a low-voltage triggered silicon-controlled rectifier is configured. A plurality of triggering components (e.g., NMOS fingers) are formed upon the substrate and integrated with the low-voltage triggered silicon-controlled rectifier, wherein the plurality of triggering components are inserted into the low-voltage triggered silicon-controlled rectifier in order to permit the low-voltage triggered silicon-controlled rectifier to protect against electrostatic discharge during human-body model and charged-device model stress events.

5 Claims, 6 Drawing Sheets

US 7,763,908 B2

DESIGN OF SILICON-CONTROLLED RECTIFIER BY CONSIDERING ELECTROSTATIC DISCHARGE ROBUSTNESS IN HUMAN-BODY MODEL AND CHARGED-DEVICE MODEL DEVICES

TECHNICAL FIELD

Embodiments are generally related to semiconductor devices. Embodiments are also related to silicon-controlled rectifier (SCR) devices utilized for electrostatic discharge (ESD) protection. Embodiments also relate to low-voltage triggered silicon-controlled rectifier devices. Embodiments are additionally related to human-body model (HBM) and charged-device model (CDM) devices and components.

BACKGROUND OF THE INVENTION

Silicon-controlled rectifiers (SCR) are utilized extensively in power device applications because of the capability to switch from a very high impedance state to a very low impedance state. For the same reason, a properly designed SCR can also be a very efficient electrostatic discharge (ESD) protection device.

A semiconductor integrated circuit (IC) is generally susceptible to an electrostatic discharge (ESD) event that may damage or destroy the IC. An ESD event refers to a phenomenon of electrical discharge of a current (positive or negative) for a short duration in which a large amount of current is discharged through the IC. Protecting an IC from an ESD event, therefore, is an important factor to be considered in IC design. In deep sub-micron, or small geometry, complementary metal oxide silicon (CMOS) technology, the protection of an IC becomes an even more important issue due to the implementation of thin oxide layers in such ICs. As oxide layers become thinner, the voltage margin between oxide breakdown voltage and drain snapback breakdown voltage of a metal-oxide-silicon ("MOS") transistor is reduced.

Integrated circuits (IC's) and other semiconductor devices are extremely sensitive to the high voltages that may be generated by contact with an ESD event. As such, ESD protection circuitry is essential for integrated circuits. An ESD event commonly results from the discharge of a high voltage potential (e.g., several kilovolts) and leads to pulses of high current (e.g., several amperes) of a short duration (e.g., 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC's and thus require expensive repairs on the products, which could have been avoided by providing a mechanism for dissipation of the electrostatic discharge to which the IC may have been subjected.

The ESD problem has been especially pronounced in complementary metal oxide semiconductor (CMOS) field effect transistors. To protect against these over-voltage conditions, silicon controlled rectifiers (SCR) and other protection devices such as the grounded-gate NMOS have been incorporated within the circuitry of the CMOS IC to provide a discharge path for the high current produced by the discharge of the high electrostatic potential. Prior to an ESD event, the SCR is in a nonconductive state. Once the high voltage of an ESD event is encountered, the SCR then changes to a conductive state to shunt the current to ground. The SCR maintains this conductive state until the voltage is discharged to a safe level.

One type of SCR device that has shown promising results is a low voltage triggered SCR (LVTSCR), which is particularly robust in human-body model (HBM) events for bulk CMOS processes. FIG. 1 illustrates a cross-sectional diagram of one example of a prior art LVTSCR 100, wherein a drain junction formed by n+ region 122 is depicted across an N-well region 102 and a P-well region 104. In general, LVTSCR 100 includes a p+ region 110, an n+ region 120, an n+ region 122, a p+ region 124, and an n+ region 126. An anode 103 can be provided at nodes 136, 138, and 140, while a cathode is generally provided at nodes 128, 130, 132, and 134.

Note that electrically, nodes 136, 138, and 140 comprise the same electrical node or point. Similarly, 128, 130, 132, and 134 also electrical provide the same node or point. A poly region 106 is located adjacent oxide region 108, which together form a single NMOS finger 107. Poly region 106 is electrically connected to node 134 of cathode 101. In LVTSCR 100, the N-drain junction 122 is thus designed across respective N-well and P-well regions 102, 104 so that the trigger voltage of LVTSCR 100 can be lowered by the avalanche breakdown of an embedded one-finger ggNMOS-FET's.

FIG. 2 illustrates a cross-sectional diagram of another example of a prior art LVTSCR 200, wherein a drain junction is connected to N+ diffusion within N-well by metals. LVTSCR 200 generally includes respective N-well and P-well regions 202, 204. Additionally, LVTSCR 200 includes a p+ region 210, an n+ region 220, an n+ region 222, an n+ region 223, a p+ region 224, and an n+ region 226. Note that p+ region 210, n+ region 220, and n+ region 222 are located within P-well 204, while n+ region 223, p+ region 224, and n+ region 226 are located within N-well 202. A cathode 201 is generally provided based on nodes 228, 230, 231, and 232. Similarly, an anode 203 is provided based on nodes 236, 238 and 240.

Nodes 228, 230, 231 and 232 electrically form the same node. Similarly, nodes 236, 238 and 240 also form a single electrical connection. In general, region 220 is connected to node 231. A poly region 206 is located adjacent oxide region 208, which together form a single NMOS finger 207. Region 206 is electrically connected to node 232 of cathode 201. Additionally, N+ region 222 is tied to a node 233, while n+ region 223 is tied to a node 235. Note that nodes 233 and 235 electrically comprise the same node. N+ region 222 and n+ region 223 are electrically connected to one another. Thus, instead of across N-well and P-well regions as is the case with the configuration depicted in FIG. 1, an N-drain junction formed by n+ region 222 and n+ region 223 can be separated into two different diffusions bus shorted by metals as depicted in FIG. 2.

One of the problems inherent with low voltage triggered SCR's, such as, for example, LVTSCR 100 and LVTSCR 200, is that due to a slow turn-on time in the lateral SCR, the lateral n-p-n BJT of ggNMOSFET's can become damaged as a result of associated positive and negative CDM events. Thus, although low voltage triggered SCR's are very robust in human-body model (HBM) stress conditions, such devices are very weak in CDM stress conditions. In order to overcome these problems and improve the CDM performance of low voltage triggered SCR's without scarifying HBM performance, it is believed that an improved low voltage triggered SCR should be developed utilizing NMOS inserted fingers as disclosed in further greater detail herein.

BRIEF SUMMARY

The following summary of the invention is provided to facilitate an understanding of some of the innovative features unique to the present invention and is not intended to be a full description. A full appreciation of the various aspects of the invention can be gained by taking the entire specification, claims, drawings and abstract as a whole.

It is therefore one aspect of the present invention to provide for an improved silicon-controlled rectifier utilized for ESD protection.

It is another aspect of the present invention to provide for an improved low voltage triggered silicon-controlled rectifier.

It is a further aspect of the present invention to provide for a low voltage triggered silicon-controlled rectifier with enhanced ESD protection capabilities with performance enhancements thereof under human-body model (HBM) and charged-device model (CDM) stress conditions.

It is yet a further aspect of the present invention to provide for a low voltage triggered silicon-controlled rectifier that incorporates a plurality of triggering components, such as, for example, multiple NMOS fingers.

The above and other aspects of the invention can be achieved as will now be briefly described. A silicon-controlled rectifier apparatus, comprising a substrate upon which a low-voltage triggered silicon-controlled rectifier is configured. A plurality of triggering components (e.g., NMOS fingers) are formed upon the substrate and integrated with the low-voltage triggered silicon-controlled rectifier, wherein the plurality of triggering components are inserted into the low-voltage triggered silicon-controlled rectifier in order to permit the low-voltage triggered silicon-controlled rectifier to protect against electrostatic discharge during human-body model and charged-device model stress events.

BRIEF DESCRIPTION OF THE DRAWINGS

The accompanying figures, in which like reference numerals refer to identical or functionally similar elements throughout the separate views and which are incorporated in and form part of the specification, further illustrate embodiments of the present invention.

DETAILED DESCRIPTION OF THE INVENTION

The particular values and configurations discussed in these non-limiting examples can be varied and are cited merely to illustrate embodiments of the present invention and are not intended to limit the scope thereof.

Figure 3:
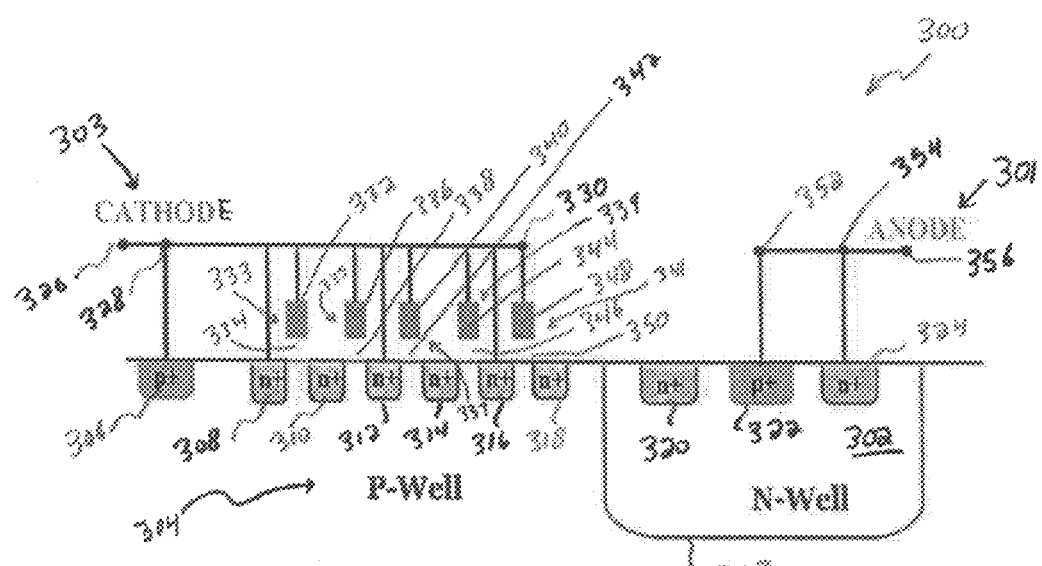
FIG. 3 illustrates a cross-sectional diagram of a low voltage triggered silicon-controlled rectifier apparatus in which a plurality of NMOS fingers are incorporated therein, in accordance with a preferred embodiment.

FIG. 3 illustrates a cross-sectional diagram of a low voltage triggered silicon-controlled rectifier (LVTSCR) apparatus 300 in which a plurality of NMOS fingers 333, 335, 337, 339, and 341 are incorporated therein, in accordance with a preferred embodiment. In order to improve the performance of an LVTSCR without scarifying HBM performance thereof, LVTSCR apparatus 300 can be inserted with multiple NMOS fingers 333, 335, 337, 339, and 341. Such an improvement can be verified, for example, utilizing 0.25 μm technology by utilizing a transmission line pulse generator (TLP). Note that as utilized herein, the acronym NMOS refers generally to "N-Channel Metal Oxide Semiconductor," which is based on a transistor technology wherein the primary current carriers are negatively charged electrons.

LVTSCR apparatus 300 generally includes a P-well region 304 and an N-well region 302. A p+ region 306 is located within P-well region 304, along with an n+ source region 308, an n+ drain region 310, an n+ source region 312, an n+ drain region 314, an n+ source region 316, and an n+ drain region 318. An n+ region 320, a p+ region 322, and an n+ region 324 are located within N-well region 302. An electrical node 352 can be connected to p+ region 322, while an electrical node 354 is connected to n+ region 324. Electrical nodes 352, 354 and 356 generally comprise the same electrical node and together form an anode 301.

A poly region 332 and an oxide region 334 are also provided, which together form NMOS finger 333. Similarly, a poly region 336 and an oxide region 338 are also provided, which together form NMOS finger 335. Additionally, a poly region 340 and an oxide region 342 can also be provided, which together form NMOS finger 337. Likewise, a poly region 344 and an oxide region 346 are also generally provided, which together form NMOS finger 339. Finally, a poly region 348 and an oxide region 350 are also provided, which together form NMOS finger 341.

An electrical node 328 is connected to p+ region 306 and also to n+ region 308. Electrical node 328 is also connected to region 332 of NMOS finger 333 and region 336 of NMOS finger 335. Electrical node 328 is further connected to region 340 of NMOS finger 337 and to region 344 of NMOS finger 339. Electrical node 328 is also connected to region 348 of NMOS finger 341. Electrical node 328 is also connected to source regions 308, 312 and 316 of NMOS fingers. Electrical node 328 is also connected to node 326 and node 330. Note that nodes 326, 328 and 330 electrically comprise the same electrical node and form a cathode 303. Also, n+ region 320 with N-well 302 is electrically connected to drain regions 310, 314 and 318 of NMOS fingers within P-well 304.

Figure 1:
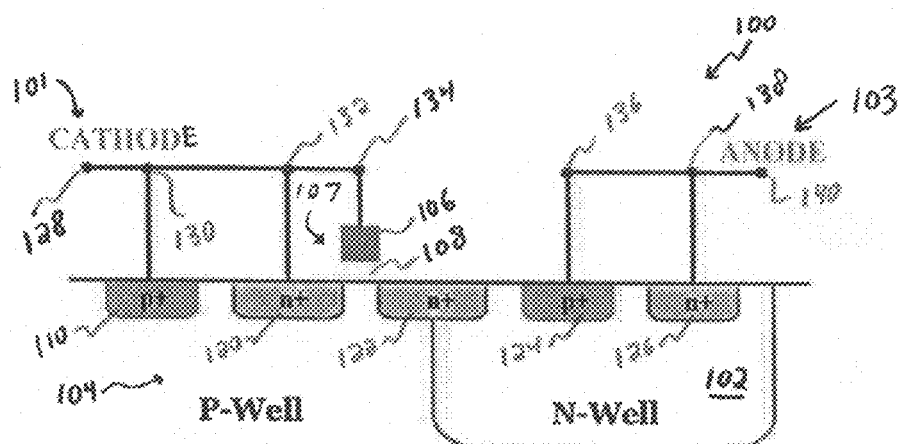
FIG. 1 illustrates a cross-sectional diagram of one example of a prior art low voltage triggered silicon-controlled rectifier, wherein a drain junction formed by n+ region is depicted across an N-well region and a P-well region.
Figure 2:
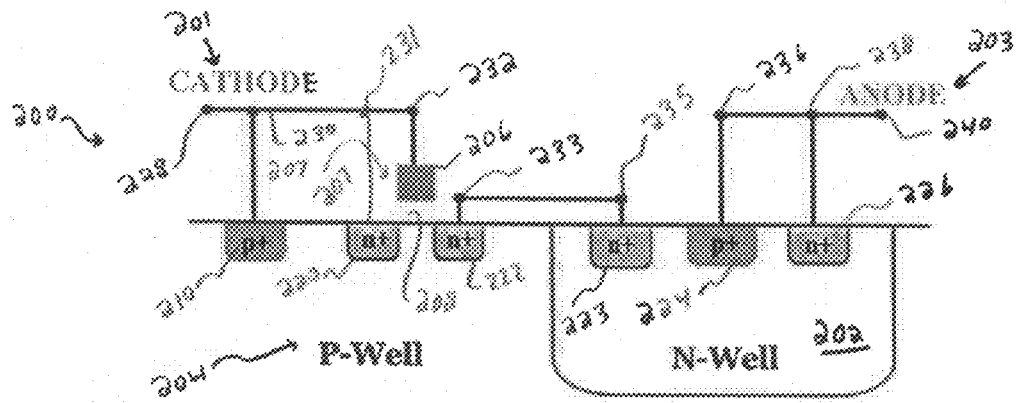
FIG. 2 illustrates a cross-sectional diagram of another example of a prior art low voltage triggered silicon-controlled rectifier, wherein a drain junction is connected to N+ diffusion within N-well by metals.

In order to improve CDM performance, inserting additional NMOS fingers within the structure of LVTSCR apparatus 300 may be helpful. Too many NMOS fingers, however, can increase the distance between the edge 323 of the N-well region 302 and P-well tap of region 304 and thus can degrade SCR performance in HBM. Thus, instead of utilizing only one NMOS finger, as is the case with SCR structures depicted in FIGS. 1-2 herein, multiple NMOS fingers 333, 335, 337, 339, and 341 can be inserted into the LVTSCR apparatus 300 structure. In the example depicted in FIG. 3, multiple NMOS fingers 333, 335, 337, 339, and 341 can possess a width of, for example, 200 μm, rather than 40 μm, which is the case with the single NMOS finger 207 depicted in FIG. 2. In the example illustrated in FIG. 3, $W_{NMOS}$=200 μm and $W_{SCR}$=40 μm, where $W_{NMOS}$ represents the NMOS finger width and is associated generally with cathode 303, while $W_{SCR}$ represents the SCR width associated with the anode 301. Note that LVTSCR apparatus 300 thus comprises a multiple NMOS Finger LVTSCR, which can be referred to by the acronym MF_LVTSCR.

Figure 4:
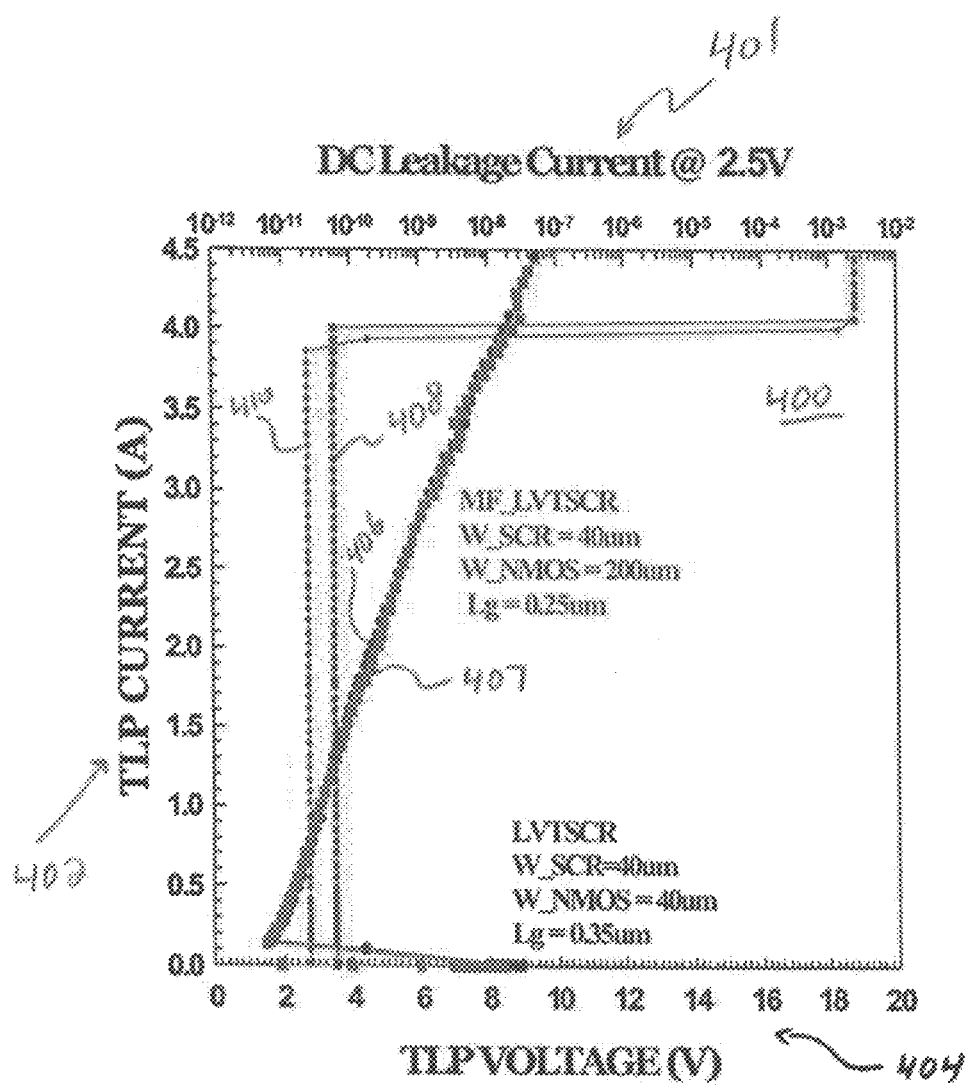
FIG. 4 illustrates a graph indicative of current versus voltage, in accordance with a preferred embodiment.

FIG. 4 illustrates a graph 400 indicative of TLP current 402 versus TLP voltage 404, and DC leakage current 401 versus TLP current 402, in accordance with a preferred embodiment. Graph 400 generally plots TLP pulsed I-V characteristics of a traditional LVTSCR (e.g., LVTSCR 100, 200) and an MF_LVTSCR (e.g., LVTSCR apparatus 300). Lines 406 and 407 depicted in FIG. 4 generally represent TLP I-V characteristics and lines 408 and 410 re the present DC leakage current measurements at 2.5V after each TLP stress. MF_LVTSCR data is indicated in graph 400 generally be lines 407 and 408, while traditional SCR data is indicated by lines 406 and 410.

Compared to the use of only a single NMOS finger, such as NMOS finger 207 of LVTSCR 200, the configuration of an MF_LVTSCR as illustrated by graph 400 shows that TLP pulsed I-V characteristics are almost identical for NMOS with W=40 μm and W=200 μm in the SCR with W=40 μm. Such a scenario results in the conclusion that an LVTSCR with multiple NMOS fingers (i.e., an MF_LVTSCR) sustains the same HBM performance. Graph 400 demonstrates that because the total width of the NMOS fingers increases in an MF_LVTSCR, the NMOS fingers 333, 335, 337, 339, and 341, for example, can withstand CDM stress current if the SCR is not turned on fast enough.

Figure 5:
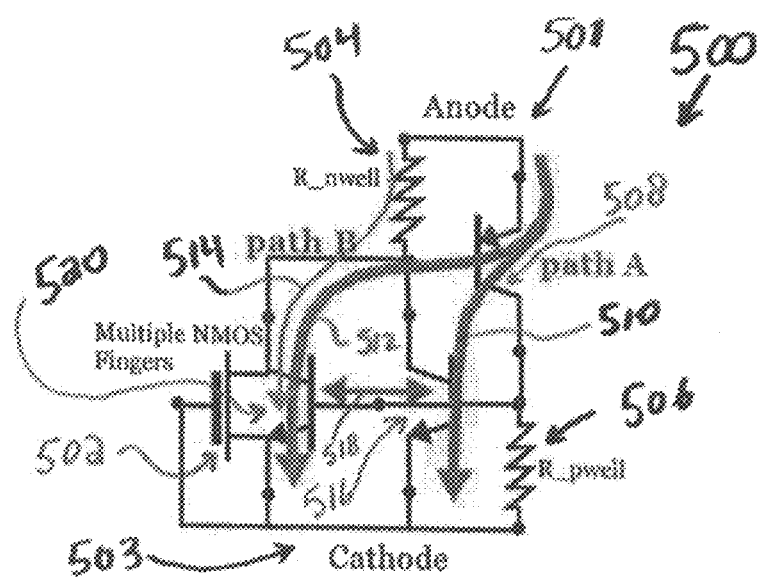
FIG. 5 illustrates a schematic circuit of a low-voltage triggered silicon-controlled rectifier apparatus in accordance with a preferred embodiment.

FIG. 5 illustrates a schematic circuit 500 of a low-voltage triggered silicon-controlled rectifier in accordance with a preferred embodiment. Circuit 500 is indicative of the electrical structure, for example, of LVTSCR apparatus 300 depicted in FIG. 3. An anode 501 is also depicted in FIG. 5 and is connected to an N-well region or tap 504. An N-well resistor (i.e. R_nwell) can be formed between tap 504 and the n+ region 320 of FIG. 3. The p-n-p bipolar transistor 508 can be formed by p+ region 322, N-well 302 and P-well 304 in FIG. 3. The n-p-n bipolar transistor 516 is generally formed by N-well 302, P-well 304, n+ source regions 308, 312, 316 of NMOS fingers within P-well in FIG. 3. A P-well resistor (i.e. R_pwell) can be also formed between P-well 304 and p+ region 306 in FIG. 3. These two transistors 508 and 516 construct the SCR structure.

The multiple NMOS fingers are electrically connected to n+ region 320 with N-well 304 in FIG. 3, and thus form the n-p-n bipolar transistor 520. Because the transistors 520 and 516 can interact with each other, the bipolar transistor 520 plays as the trigger transistor of the SCR structure. In circuit 500, path 510 (i.e., path A) is comprised of the transistors 508 and 516, and represents the SCR current path that dominates during HBM events. Path 512 (i.e., path B), however, involves a P/N diode in series with NMOS fingers, which will sink the CDM current. It should be noted that although there is another current path 514 from an N-well tap to the NMOS fingers, the high ESD current will not flow through the N-well tap because of a higher voltage drop within the N-well resistor (e.g., >0.7 V). This path triggers the NMOS fingers in lower ESD currents and sinks the ESD current during negative HBM stresses and positive CDM stresses. In general, in circuit 500, $W_{NMOS}$>5 $W_{SCR}$.

Figure 6:
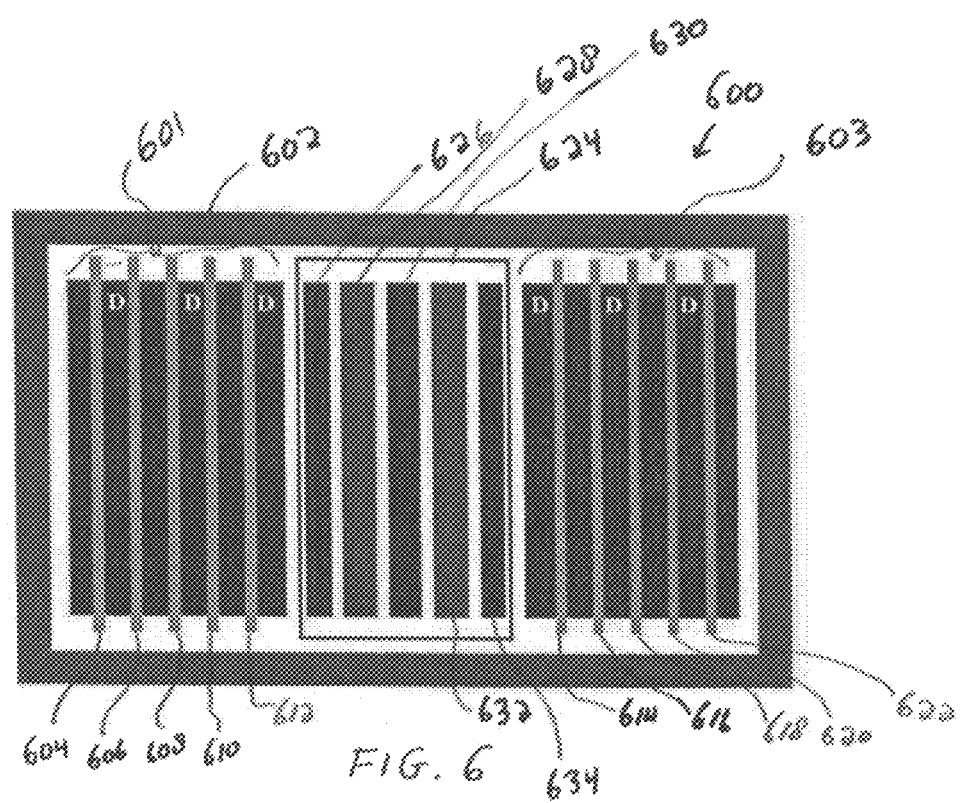
FIG. 6 illustrates a schematic layout of a multiple NMOS finger low-voltage triggered silicon-controlled rectifier apparatus with ten NMOS fingers in accordance with one embodiment.

FIG. 6 illustrates a schematic layout of a multiple NMOS finger low-voltage triggered silicon-controlled rectifier (MF_LVTSCR) apparatus 600 with ten NMOS fingers in accordance with one embodiment. MF_LVTSCR apparatus 600 generally includes two sets of NMOS fingers. The first set of NMOS fingers is composed of NMOS fingers 604, 606, 608, 610 and 612. The second set of NMOS fingers is composed of NMOS fingers 614, 616, 618, 620 and 622. NMOS fingers 604, 606, 608, 610 and 612 are associated with NMOS 601, while NMOS fingers 614, 616, 618, 620 and 620 are associated with NMOS 603.

An N-well region 624 is also indicated in FIG. 6, including respective N and P regions 626, 628, 630, 632 and 634. The N region 630 and the P regions 628 and 632 are electrically connected to the anode. The N region 626 is electrically connected to drains of NMOS 601 marked as "D", and the N region 634 is electrically connected to drains of NMOS 603 marked as "D". The aforementioned components are all surrounded by P-well tap 602. In the layout of MF_LVTSCR apparatus 600, each five NMOS fingers are designed in each side of the SCR apparatus 600, and thus both HBM and CDM performances are improved. For example, the total width of NMOS fingers can be approximately 400μm for the SCR with W=40μm. Because the total width of NMOS fingers increases in MF LVTSCR, the NMOS fingers can withstand CDM stress current if the SCR is not turned on quickly enough. Using such a structure, the failure current of MF_LVTSCR apparatus 600 can be up to, for example, 6 Amps, compared to 4 Amps with respect to the data indicated in graph 400 of FIG. 4.

Regarding FIG. 6, it is important to note that the drains of NMOS fingers 601 and 603 are indicated respectively by "D". In 601, there are three drains (marked as "D"), and four sources. Similarly, NMOS finger 603 includes three drains (marked as "D") and four sources. The drains of NMOS fingers 601 are electrically connected to region 626, and the drains of NMOS fingers 603 are electrically connected to region 634.

Figure 7:
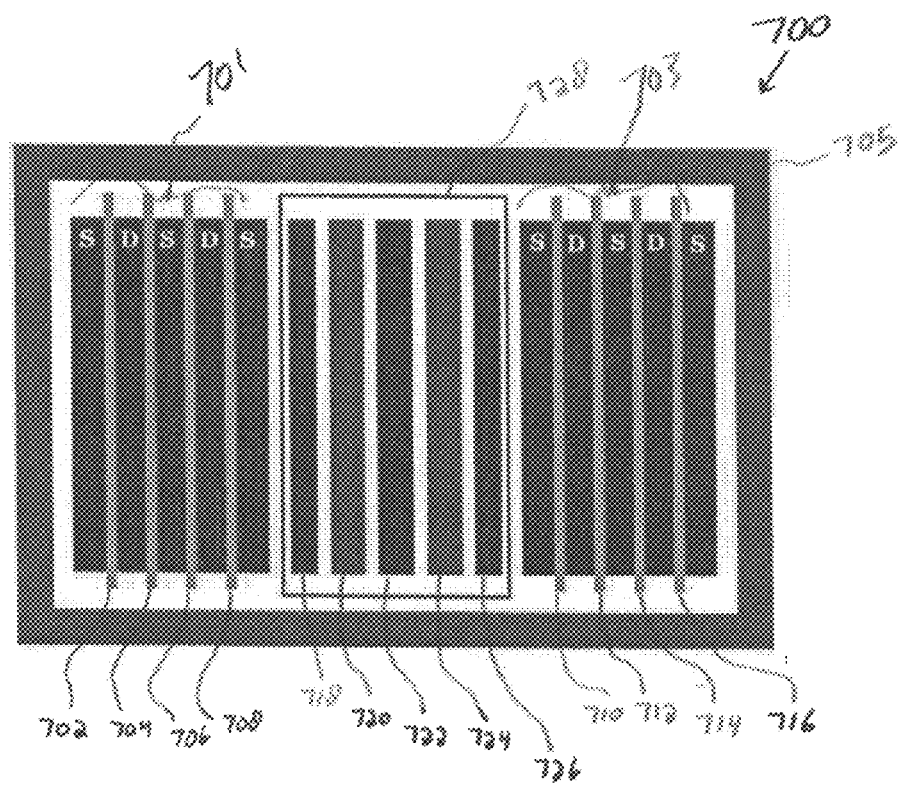
FIG. 7 illustrates a schematic layout of a multiple NMOS finger low-voltage triggered silicon-controlled rectifier apparatus with eight NMOS fingers, wherein the NMOS source is located next to the N-well edge, in accordance with an alternative embodiment.

FIG. 7 illustrates another schematic layout of a multiple NMOS finger low-voltage triggered silicon-controlled rectifier (MF_LVTSCR) apparatus 700 with eight NMOS fingers 702, 704, 706, 708 and 710, 712, 714, 716 in accordance with an alternative embodiment, wherein the NMOS source (i.e., marked as "S") is located next to the N-well edge, in accordance with an alternative embodiment.

In the configuration depicted in FIG. 7, four NMOS fingers 702, 704, 706, 708 are designed on one side of MF_LVTSCR apparatus 700, while four NMOS fingers 710, 712, 714, 716 are designed on the opposite side thereof for a total of eight NMOS fingers. Thus, in the configuration of FIG. 7, the current gain of lateral n-p-n BJT in the MF_LVTSCR apparatus 700 can be increased, thus an enhanced SCR performance can be achieved. Note that in FIG. 7, the N and P regions 718, 720, 722, 724 and 726 within N-well 728 are identical to those depicted in FIG. 6. Regarding FIG. 7, it is important to note that there are two drains (marked as "D") and three sources (marked as "S") in regions 701 and 703, respectively. The drains of area 701 are electrically connected to region 718, and the drains of are 703 are electrically connected to region 726.]

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An apparatus comprising:
   a first set of five NMOS fingers;
   a second set of five NMOS fingers;
   an N-well located between said first set of five NMOS fingers and said second set of five NMOS fingers, said N-well comprising a plurality of N regions and a plurality of P regions wherein one of said plurality of N regions is electrically connected to a plurality of drains associated with said first set of five NMOS fingers and another of said plurality of N regions is electrically connected to a plurality of drains associated with said second set of five NMOS fingers;
   a P-well tap surrounding said first set of five NMOS fingers, said second set of five NMOS fingers and said N-well.

2. The apparatus of claim 1 wherein each of said NMOS fingers among said first set of five NMOS fingers and said second set of five NMOS fingers comprises a poly region and an oxide region.

3. The apparatus of claim 1 wherein said first and second sets of NMOS fingers comprise a width of approximately 400 µm.

4. The apparatus of claim 1 further comprising an anode connected to at least one N region among said plurality of N regions and at least one P region among said P regions.

5. The apparatus of claim 1 wherein a maximum failure current is approximately 6 Amps.

* * * * *